United States Patent
Yedinak et al.

(10) Patent No.: US 8,492,837 B2
(45) Date of Patent: Jul. 23, 2013

(54) REDUCED PROCESS SENSITIVITY OF ELECTRODE-SEMICONDUCTOR RECTIFIERS

(75) Inventors: Joseph A. Yedinak, Mountain Top, PA (US); Mark L. Rinehimer, Mountain Top, PA (US); Thomas E. Grebs, Mountain Top, PA (US); John L. Benjamin, Mountain Top, PA (US)

(73) Assignee: Fairchild Semiconductor Corporation, South Portland, ME (US)

(*) Notice: Subject to any disclaimer, the term of this patent is extended or adjusted under 35 U.S.C. 154(b) by 0 days.

(21) Appl. No.: 13/283,496

(22) Filed: Oct. 27, 2011

(65) Prior Publication Data
US 2012/0037982 A1      Feb. 16, 2012

Related U.S. Application Data

(63) Continuation of application No. 12/484,096, filed on Jun. 12, 2009, now Pat. No. 8,049,276.

(51) Int. Cl.
*H01L 29/872* (2006.01)

(52) U.S. Cl.
USPC .................. 257/341; 257/E21.41; 438/87

(58) Field of Classification Search
USPC .................. 257/335, 341, E21.345, E21.41, 257/E29.013; 438/87
See application file for complete search history.

(56) References Cited

U.S. PATENT DOCUMENTS

| | | | |
|---|---|---|---|
| 3,964,084 A | 6/1976 | Andrews et al. |
| 4,641,174 A | 2/1987 | Baliga |
| 4,697,201 A | 9/1987 | Mihara |
| 4,767,722 A | 8/1988 | Blanchard |
| 4,796,070 A | 1/1989 | Black |
| 4,876,579 A | 10/1989 | Davis et al. |
| 4,881,105 A | 11/1989 | Davari et al. |
| 4,893,160 A | 1/1990 | Blanchard |
| 4,914,058 A | 4/1990 | Blanchard |
| 4,941,026 A | 7/1990 | Temple |
| 4,942,445 A | 7/1990 | Baliga et al. |
| 4,954,854 A | 9/1990 | Dhong et al. |
| 4,974,059 A | 11/1990 | Kinzer |
| 4,982,260 A | 1/1991 | Chang et al. |
| 4,994,883 A | 2/1991 | Chang et al. |
| 5,028,548 A | 7/1991 | Nguyen |
| 5,034,341 A | 7/1991 | Itoh |
| 5,072,266 A | 12/1991 | Bulucea et al. |
| 5,077,228 A | 12/1991 | Eklund et al. |
| 5,101,244 A | 3/1992 | Mori et al. |
| 5,119,153 A | 6/1992 | Korman et al. |
| 5,126,807 A | 6/1992 | Baba et al. |
| 5,216,275 A | 6/1993 | Chen |

(Continued)

FOREIGN PATENT DOCUMENTS

| | | | |
|---|---|---|---|
| WO | WO 2006-135746 A2 | 12/2006 |
| WO | WO 2007-002857 A2 | 1/2007 |

*Primary Examiner* — Thomas L Dickey

(57) ABSTRACT

Disclosed are semiconductor devices and methods of making semiconductor devices. An exemplary embodiment comprises a semiconductor layer of a first conductivity type having a first surface, a second surface, and a graded net doping concentration of the first conductivity type within a portion of the semiconductor layer. The graded portion is located adjacent to the top surface of the semiconductor layer, and the graded net doping concentration therein decreasing in value with distance from the top surface of the semiconductor layer. The exemplary device also comprises an electrode disposed at the first surface of the semiconductor layer and adjacent to the graded portion.

22 Claims, 6 Drawing Sheets

U.S. PATENT DOCUMENTS

| | | | |
|---|---|---|---|
| 5,233,215 A | 8/1993 | Baliga | |
| 5,241,195 A | 8/1993 | Tu et al. | |
| 5,262,336 A | 11/1993 | Pike, Jr. et al. | |
| 5,321,289 A | 6/1994 | Baba et al. | |
| 5,346,835 A | 9/1994 | Malhi et al. | |
| 5,365,102 A | 11/1994 | Mehrotra et al. | |
| 5,393,998 A | 2/1995 | Ishii et al. | |
| 5,424,563 A | 6/1995 | Temple et al. | |
| 5,430,324 A | 7/1995 | Bencuya | |
| 5,508,534 A | 4/1996 | Nakamura et al. | |
| 5,510,634 A | 4/1996 | Okabe et al. | |
| 5,528,058 A | 6/1996 | Pike, Jr. et al. | |
| 5,541,425 A | 7/1996 | Nishihara | |
| 5,541,430 A | 7/1996 | Terashima | |
| 5,545,915 A | 8/1996 | Disney et al. | |
| 5,557,127 A | 9/1996 | Ajit et al. | |
| 5,567,635 A | 10/1996 | Acovic et al. | |
| 5,578,851 A | 11/1996 | Hshieh et al. | |
| 5,589,405 A | 12/1996 | Contiero et al. | |
| 5,597,765 A | 1/1997 | Yilmaz et al. | |
| 5,602,046 A | 2/1997 | Calafut et al. | |
| 5,605,852 A | 2/1997 | Bencuya | |
| 5,607,875 A | 3/1997 | Nishizawa et al. | |
| 5,612,567 A * | 3/1997 | Baliga | 257/475 |
| 5,637,898 A | 6/1997 | Baliga | |
| 5,639,676 A | 6/1997 | Hshieh et al. | |
| 5,644,150 A | 7/1997 | Iwamuro | |
| 5,665,996 A | 9/1997 | Williams et al. | |
| 5,777,362 A | 7/1998 | Pearce | |
| 5,807,783 A | 9/1998 | Gaul et al. | |
| 5,814,858 A | 9/1998 | Williams | |
| 5,828,101 A | 10/1998 | Endo | |
| 5,856,692 A | 1/1999 | Williams et al. | |
| 5,859,446 A | 1/1999 | Nagasu et al. | |
| 5,877,528 A | 3/1999 | So | |
| 5,877,538 A | 3/1999 | Williams | |
| 5,894,149 A | 4/1999 | Uenishi et al. | |
| 5,920,108 A | 7/1999 | Hemmenway et al. | |
| 5,932,897 A | 8/1999 | Kawaguchi et al. | |
| 5,949,124 A | 9/1999 | Hadizad et al. | |
| 5,972,741 A | 10/1999 | Kubo et al. | |
| 5,973,368 A | 10/1999 | Pearce et al. | |
| 5,998,822 A | 12/1999 | Wada et al. | |
| 6,020,270 A | 2/2000 | Wong et al. | |
| 6,049,108 A | 4/2000 | Williams et al. | |
| 6,051,468 A | 4/2000 | Hshieh | |
| 6,060,744 A | 5/2000 | Kuwahara et al. | |
| 6,078,090 A | 6/2000 | Williams et al. | |
| 6,104,054 A | 8/2000 | Corsi et al. | |
| 6,110,763 A | 8/2000 | Temple | |
| 6,130,458 A | 10/2000 | Takagi et al. | |
| 6,137,152 A | 10/2000 | Wu | |
| 6,140,680 A | 10/2000 | Pulvirenti | |
| 6,168,996 B1 | 1/2001 | Numazawa et al. | |
| 6,174,773 B1 | 1/2001 | Fujishima | |
| 6,188,104 B1 | 2/2001 | Choi et al. | |
| 6,188,105 B1 | 2/2001 | Kocon et al. | |
| 6,208,185 B1 | 3/2001 | John et al. | |
| 6,242,787 B1 | 6/2001 | Nakayama et al. | |
| 6,252,277 B1 | 6/2001 | Chan et al. | |
| 6,259,136 B1 | 7/2001 | Kawaguchi et al. | |
| 6,262,439 B1 | 7/2001 | Takeuchi et al. | |
| 6,274,437 B1 | 8/2001 | Evans | |
| 6,274,905 B1 | 8/2001 | Mo | |
| 6,316,280 B1 | 11/2001 | Fujiwara | |
| 6,337,499 B1 | 1/2002 | Werner | |
| 6,362,026 B2 | 3/2002 | Zeng et al. | |
| 6,365,462 B2 | 4/2002 | Baliga | |
| 6,376,878 B1 | 4/2002 | Kocon | |
| 6,384,955 B2 | 5/2002 | Tada et al. | |
| 6,388,286 B1 | 5/2002 | Baliga | |
| 6,392,290 B1 | 5/2002 | Kasem et al. | |
| 6,396,102 B1 | 5/2002 | Calafut | |
| 6,437,386 B1 | 8/2002 | Hurst et al. | |
| 6,437,419 B1 | 8/2002 | Bhalla et al. | |
| 6,445,035 B1 | 9/2002 | Zeng et al. | |
| 6,459,113 B1 | 10/2002 | Morihara et al. | |
| 6,461,918 B1 | 10/2002 | Calafut | |
| 6,465,325 B2 | 10/2002 | Ridley et al. | |
| 6,482,681 B1 | 11/2002 | Francis et al. | |
| 6,492,663 B1 | 12/2002 | Blanchard | |
| 6,514,857 B1 | 2/2003 | Naik et al. | |
| 6,534,825 B2 | 3/2003 | Calafut | |
| 6,548,317 B2 | 4/2003 | Taniguchi et al. | |
| 6,573,558 B2 | 6/2003 | Disney | |
| 6,573,569 B2 | 6/2003 | Hao et al. | |
| 6,586,800 B2 | 7/2003 | Brown | |
| 6,602,768 B2 | 8/2003 | Kocon et al. | |
| 6,620,653 B2 | 9/2003 | Matsudai et al. | |
| 6,624,472 B2 | 9/2003 | Hurkx et al. | |
| 6,635,535 B2 | 10/2003 | Hao et al. | |
| 6,638,826 B2 | 10/2003 | Zeng et al. | |
| 6,653,161 B1 | 11/2003 | Morse | |
| 6,653,740 B2 | 11/2003 | Kinzer et al. | |
| 6,673,680 B2 | 1/2004 | Calafut | |
| 6,673,681 B2 | 1/2004 | Kocon et al. | |
| 6,677,626 B1 | 1/2004 | Shindou et al. | |
| 6,680,232 B2 | 1/2004 | Grebs et al. | |
| 6,683,346 B2 | 1/2004 | Zeng | |
| 6,683,363 B2 | 1/2004 | Challa | |
| 6,690,062 B2 | 2/2004 | Henninger et al. | |
| 6,696,726 B1 | 2/2004 | Bencuya et al. | |
| 6,696,728 B2 | 2/2004 | Onishi et al. | |
| 6,700,158 B1 | 3/2004 | Cao et al. | |
| 6,710,406 B2 | 3/2004 | Mo et al. | |
| 6,724,042 B2 | 4/2004 | Onishi et al. | |
| 6,734,497 B2 | 5/2004 | Takahashi et al. | |
| 6,750,508 B2 | 6/2004 | Omura et al. | |
| 6,777,747 B2 | 8/2004 | Yedinak et al. | |
| 6,798,019 B2 | 9/2004 | Yedinak et al. | |
| 6,802,719 B2 | 10/2004 | Finney | |
| 6,803,626 B2 | 10/2004 | Sapp et al. | |
| 6,809,375 B2 | 10/2004 | Takemori et al. | |
| 6,818,947 B2 | 11/2004 | Grebs et al. | |
| 6,825,510 B2 | 11/2004 | Probst | |
| 6,828,195 B2 | 12/2004 | Mo et al. | |
| 6,831,329 B2 | 12/2004 | Yedinak et al. | |
| 6,838,722 B2 | 1/2005 | Bhalla et al. | |
| 6,844,592 B2 | 1/2005 | Yamaguchi et al. | |
| 6,861,701 B2 | 3/2005 | Williams et al. | |
| 6,906,362 B2 | 6/2005 | Yedinak et al. | |
| 6,916,745 B2 | 7/2005 | Herrick et al. | |
| 6,979,874 B2 | 12/2005 | Harada | |
| 6,982,459 B2 | 1/2006 | Suzuki et al. | |
| 7,005,351 B2 | 2/2006 | Henninger et al. | |
| 7,064,385 B2 | 6/2006 | Dudek et al. | |
| 7,078,296 B2 | 7/2006 | Chau et al. | |
| 7,091,573 B2 | 8/2006 | Hirler et al. | |
| 7,118,951 B2 | 10/2006 | Yedinak et al. | |
| 7,132,712 B2 | 11/2006 | Kocon et al. | |
| 7,148,111 B2 | 12/2006 | Mo et al. | |
| 7,170,119 B2 | 1/2007 | Yamauchi et al. | |
| 7,250,343 B2 | 7/2007 | Kotek et al. | |
| 7,319,256 B1 | 1/2008 | Kraft et al. | |
| 7,344,943 B2 | 3/2008 | Herrick et al. | |
| 7,345,342 B2 | 3/2008 | Challa et al. | |
| 7,352,036 B2 | 4/2008 | Grebs et al. | |
| 7,382,019 B2 | 6/2008 | Marchant et al. | |
| 7,385,248 B2 | 6/2008 | Herrick et al. | |
| 7,393,749 B2 | 7/2008 | Yilmaz et al. | |
| 7,416,948 B2 | 8/2008 | Kraft et al. | |
| 7,436,021 B2 | 10/2008 | Hao et al. | |
| 7,446,374 B2 | 11/2008 | Thorup et al. | |
| 7,449,354 B2 | 11/2008 | Marchant et al. | |
| 7,476,589 B2 | 1/2009 | Grebs et al. | |
| 7,485,532 B2 | 2/2009 | Marchant et al. | |
| 7,504,303 B2 | 3/2009 | Yilmaz et al. | |
| 7,504,306 B2 | 3/2009 | Sapp et al. | |
| 7,511,339 B2 | 3/2009 | Mo et al. | |
| 7,514,322 B2 | 4/2009 | Yilmaz et al. | |
| 7,521,773 B2 | 4/2009 | Yilmaz et al. | |
| 7,560,771 B2 | 7/2009 | Nakamura et al. | |
| 7,582,519 B2 | 9/2009 | Kocon et al. | |
| 7,595,524 B2 | 9/2009 | Herrick et al. | |
| 7,595,542 B2 | 9/2009 | Park | |
| 7,598,144 B2 | 10/2009 | Herrick et al. | |
| 7,612,408 B2 | 11/2009 | Zundel et al. | |

| | | | | | | |
|---|---|---|---|---|---|---|
| 7,625,793 B2 | 12/2009 | Calafut | | 2007/0001230 A1 | 1/2007 | Lee et al. |
| 7,625,799 B2 | 12/2009 | Yilmaz et al. | | 2007/0029597 A1 | 2/2007 | Lee et al. |
| 7,638,841 B2 | 12/2009 | Challa | | 2007/0032020 A1 | 2/2007 | Grebs et al. |
| 2005/0161735 A1 | 7/2005 | Aoki et al. | | 2007/0069324 A1 | 3/2007 | Takaishi |
| 2005/0167742 A1 | 8/2005 | Challa et al. | | 2007/0181927 A1 | 8/2007 | Yedinak et al. |
| 2005/0181564 A1 | 8/2005 | Hshieh et al. | | 2008/0017920 A1 | 1/2008 | Sap et al. |
| 2005/0224848 A1 | 10/2005 | Kurosaki et al. | | 2008/0265312 A1 | 10/2008 | Bhalla et al. |
| 2005/0242411 A1 | 11/2005 | Tso | | 2009/0035900 A1 | 2/2009 | Thorup et al. |
| 2006/0202264 A1* | 9/2006 | Bhalla et al. ............ 257/330 | | 2009/0200606 A1 | 8/2009 | Yilmaz et al. |
| 2006/0267088 A1 | 11/2006 | Sharp et al. | | 2010/0032790 A1 | 2/2010 | Rinehimer |
| 2006/0267090 A1 | 11/2006 | Sapp et al. | | | | |
| 2006/0273386 A1 | 12/2006 | Yilmaz et al. | | * cited by examiner | | |
| 2006/0289929 A1 | 12/2006 | Andrews | | | | | ic # REDUCED PROCESS SENSITIVITY OF ELECTRODE-SEMICONDUCTOR RECTIFIERS

CROSS-REFERENCE TO RELATED APPLICATION

This application is a continuation of U.S. application Ser. No. 12/484,096, entitled "Reduced Process Sensitivity of Electrode-Semiconductor Rectifiers," filed on Jun. 12, 2009, to issue as U.S. Pat. No. 8,049,276 on Nov. 1, 2011, which is herein incorporated by reference in its entirety for all purposes.

BACKGROUND

The present subject matter relates in general to semiconductor technology, and in particular to power semiconductor devices and methods of manufacturing the same.

Electrode-semiconductor rectifiers comprise a broad range of semiconductor devices that have a conductive electrode layer contacting a semiconductor layer to form an electrical junction between the two materials that has an asymmetric current-voltage characteristic. A typical asymmetric current-voltage characteristic has a greater amount of current conduction for one voltage orientation (e.g., "forward-bias" voltage) than for another voltage orientation (e.g., "reverse-bias" voltage). An example of a electrode-semiconductor rectifier is a Schottky-barrier diode. Other types of electrode-semiconductor rectifiers exist.

SUMMARY

As part of making the present subject matter, Applicants have discovered that the electrical characteristics of electrode-semiconductor rectifiers can vary widely across the semiconductor wafer and between lots of semiconductor wafers when certain electrode materials are used. Also, Applicants have found that these large variations are due to the relatively large surface roughness caused by electrode formation processes.

Applicants have discovered that the above variations in electrical properties can be significantly reduced by grading the net doping concentration in the semiconductor material adjacent to (e.g., near or close to but not necessarily touching) the electrode such that said concentration decreases in value with distance from the electrode. In a typical embodiment, the graded region may be located within a half-micron of the electrode. In a typical embodiment having a shielding trench disposed adjacent to the electrode, the graded region may be located within a distance from the electrode, the distance being the greater of one-half micron or one-half the depth of the shielding trench. In Schottky barrier diode embodiments according to the present application, the net doping concentration in the semiconductor material adjacent to the electrode is sufficiently low to prevent the formation of an ohmic contact.

One exemplary embodiment is directed to a semiconductor device broadly comprising: a semiconductor layer of a first conductivity type having a first surface, a second surface, and a graded net doping concentration of the first conductivity type within a portion of the semiconductor layer, the graded net doping concentration decreasing in value with distance from the top surface of the semiconductor layer; and an electrode disposed at the first surface of the semiconductor layer and adjacent to the portion of graded net doping concentration of the first conductivity type.

In a further exemplary embodiment to prior exemplary embodiment, the portion of graded net doping concentration is located within a half-micron of the top surface of the semiconductor layer, or within one-half of the height of the mesa (if a mesa is present), or within the greater of these two values.

Another exemplary embodiment is directed to forming a semiconductor device broadly comprising: forming a mesa region of semiconductor material having a top surface and a portion of graded net doping concentration of a first conductivity type adjacent to the top surface, the graded net doping concentration therein decreasing in value with distance from the top surface of the mesa region; and forming a contact electrode on the top surface of the mesa region.

In a further exemplary embodiment to prior exemplary embodiment, the portion of graded net doping concentration is located within a half-micron of the top surface of the semiconductor layer, or within one-half of the height of the mesa, or within the greater of these two values.

Additional exemplary embodiments are directed to trench-shielded devices and methods of making such devices. An exemplary embodiment of such a device comprises: a semiconductor layer of a first conductivity type having a first surface, a second surface, and a mesa region, the mesa region having a top surface adjacent to the layer's first surface, and a graded net doping concentration of the first conductivity type within a first portion of the mesa region, the graded net doping concentration decreasing in value with distance from the top surface of the mesa region; a trench electrode extending in the semiconductor layer and adjacent to the mesa region, the trench having an electrically insulated electrode disposed therein and extending from the semiconductor layer's first surface toward the semiconductor layer's second surface to a first depth below the layer's first surface; a second electrode disposed at the top surface of the mesa region; a third electrode electrically coupled to the semiconductor layer; and wherein the first portion is located within a first distance of the top surface of the semiconductor layer, the first distance being the greater of one-half micron or one-half the first depth. The second electrode may comprise a Schottky contact and/or a silicide contact.

An exemplary method embodiment of making a trench-shielded device comprises: forming a region of graded net doping concentration of a first conductivity type within a portion of a semiconductor layer, the graded net doping concentration decreasing in value with distance from the first surface of the semiconductor layer; forming one or more electrically insulated trench electrodes in the semiconductor layer at the first surface thereof to define a mesa region in the semiconductor layer at the first surface thereof, the mesa region having a top surface at the first surface of the semiconductor layer; and forming a contact electrode on the top surface of at least one mesa.

These and other embodiments are described in detail in the Detailed Description with reference to the Figures.

Various aspects of the exemplary embodiments disclosed herein may be used alone or in combination.

DETAILED DESCRIPTION

Figure 1:
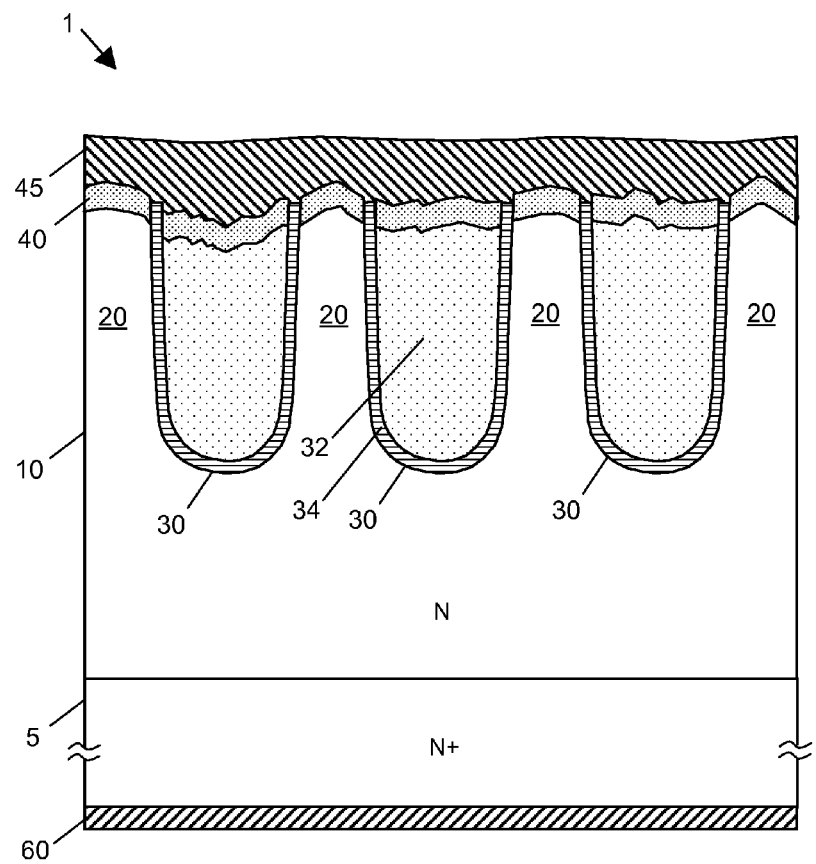
FIG. 1 shows a representation of a scanning electron microscope (SEM) cross-sectional micrograph of a comparative trench-shielded Schottky barrier diode.

The techniques in accordance with the present subject matter will be described more fully hereinafter with reference to the accompanying drawings, in which exemplary embodiments of the present subject matter are shown. The present subject matter may, however, be embodied in different forms and should not be construed as limited to the embodiments set forth herein. Rather, these embodiments are provided so that this disclosure is thorough and complete and fully conveys the scope of the present subject matter to one skilled in the art. In the drawings, the thicknesses of layers and regions may be exaggerated for clarity. The same reference numerals are used to denote the same elements throughout the specification.

It will be understood that when an element, such as a layer, a region, an electrode, etc., is referred to as being "over," "on," "connected to," "coupled to," "electrically coupled to," etc. another element, it may be directly over, on, connected to, or coupled to the other element, or intervening elements may be present. In contrast, when an element is referred to as being "directly on," "directly connected to," "directly coupled to," "directly electrically connected to," etc. another element, there are no intervening elements present. It may be appreciated that the claims of the application may be amended to recite exemplary relationships described in the specification or shown in the figures with the support thereof being provided by the original application. Spatially relative terms, such as "over," "under," "above," "below," "upper," "lower," "front," "back," "right," "left," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "below" other elements or features would then be oriented "over" or "above" the other elements or features. Thus, the exemplary term "above" may encompass both an above and below orientation.

The terms used herein are for illustrative purposes and should not be construed to limit the meaning or the scope of the present subject matter. As used in this specification, a singular form may, unless definitely indicating a particular case in terms of the context, include a plural form. Also, the expressions "comprise" and/or "comprising" used in this specification neither define the mentioned shapes, numbers, steps, actions, operations, members, elements, and/or groups of these, nor exclude the presence or addition of one or more other different shapes, numbers, steps, operations, members, elements, and/or groups of these, or addition of these. The term "and/or" used herein includes any and all combinations of one or more of the associated listed items. As used herein, ordinal terms such as "first," "second," etc. are used to describe various items and distinguish one item from another item. It should be understood that the items are not be defined by these ordinal terms. Thus, a first item which will be described may also refer to a second item without departing from the scope of the present subject matter.

As is known in the semiconductor art, there are n-type dopants (e.g., arsenic, phosphorus) that may be implanted, diffused, or grown into a semiconductor region to make it n-type, and there are p-type dopants (e.g., boron) that may be implanted, diffused, or grown into a semiconductor region to make the region p-type. In many device fabrication processes, it is common to implant or diffuse an n-type dopant into an existing p-type region to make a sub-region that is n-type. In that n-type sub-region, the concentration of n-type dopant exceeds the concentration of the p-type dopant. There is a "net" n-type doping concentration in that sub-region that is equal to the concentration of the introduced n-type dopant minus the concentration of the existing p-type dopant. A substantial portion of the electrical properties of the n-type sub-region is related to the net n-type doping concentration (rather than the concentration of the introduced n-type dopant), and for that reason the semiconductor art makes the distinction between net and introduced concentrations. Other regions of a device may be formed with a single type of dopant introduced into the regions during formation, in which case the "net" doping concentration is equal to the introduced doping concentration. Gross and net doping concentrations may be specified herein with units of gross or net dopant atoms per cubic centimeter, both of which are abbreviated herein as $cm^{-3}$.

FIG. 1 shows a representation of a scanning electron microscope (SEM) cross-sectional micrograph of a comparative trench-shielded Schottky barrier diode 1. Semiconductor device 1 comprises a net n+ doped substrate 5, an n-type semiconductor layer 10 disposed on substrate 5, a plurality of electrically insulated trench electrodes 30 disposed at the top surface of semiconductor layer 10, and a plurality of semiconductor mesa regions 20 disposed between the trench electrodes 30. A trench electrode 30 may comprise a center conductive polysilicon electrode 32 and an outer electrically insulating oxide layer 34. Device 1 further comprises a nickel silicide layer 40 formed at the top surfaces of polysilicon electrodes 32 and mesas 20, a metal layer 45 formed over nickel silicide layer 40, and an metal electrode layer 60 formed at the back surface of substrate 105. Nickel silicide layer 40 may be formed by depositing a layer of elemental nickel on the surfaces of mesas 20 and polysilicon electrodes 32, and thereafter heating the surface of the substrate to a high temperature to form a nickel silicide layer. During this formation process, top portions of the silicon and polysilicon are consumed. Typically, 0.05 microns to 0.25 microns of silicon are consumed. Nickel silicide provides a low forward voltage for the device, but the inventors have discovered that its formation roughens the surfaces of mesas 20 and polysilicon electrodes 32, as illustrated FIG. 1. Prior to depositing the elemental nickel on the surfaces of mesas 20 and electrodes 32, a small amount of p-type dopant (e.g., boron) is implanted at the top surfaces of mesas 20 to reduce the net n-type doping concentration at the mesa's top surface, which ensures that the nickel silicide does not form an ohmic contact to the mesa. The implant energy is low, being equal to or less than 40 KeV.

As part of making the present subject matter, the inventors have discovered that the formation of nickel silicide layer 40 leads to a relatively large variation in the electrical properties of the devices made on a wafer, and of the devices made from different wafers made by the same process sequence. It is currently believed that these large variations are due to the relatively large surface roughness caused by the nickel silicide formation process. As an inventive aspect of the present application, the inventors have discovered that the above variations in electrical properties can be significantly reduced by grading the net doping concentration in a portion of the mesa to decrease in value with distance from the top surface of the mesa, as measured along the center line of the mesa region. In a typical embodiment, the graded portion may be located within the top-half of the mesa of the fully-manufactured device, and may be within the topmost half-micron of mesa of the fully-manufactured device, particularly for devices having mesas shorter than one micron or two microns. The graded region may be located within the topmost quarter-micron of mesa of the fully-manufactured device, particularly for devices having mesas shorter than one micron or two microns. In general, the portion of graded net doping concentration is located within a half-micron of the top surface of the semiconductor layer, or within one-half of the height of the mesa, whichever is greater. In Schottky barrier diode embodiments according to the present subject matter, the net doping concentration at the top surface of the mesa is sufficiently low to prevent the formation of an ohmic contact. In contrast, the comparative device has a net doping concentration along the center line of the mesa region that increases with distance from the top surface of the mesa region.

Figure 2:
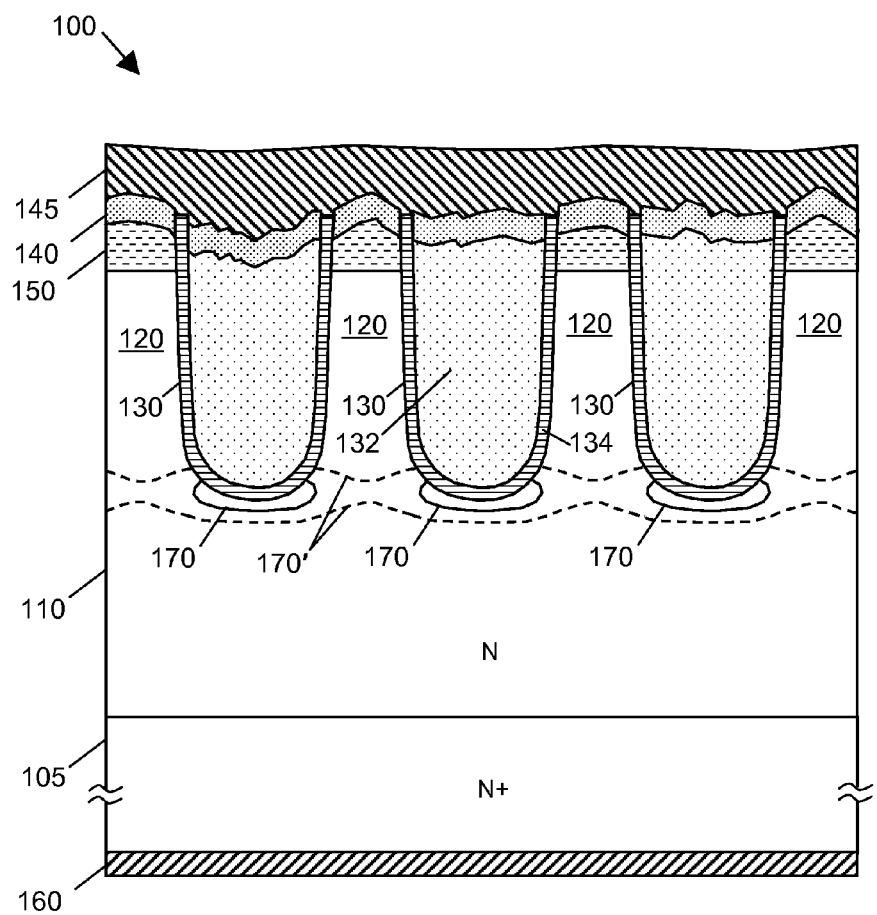
FIG. 2 shows a cross section of an exemplary trench-shielded Schottky barrier diode device according to the present subject matter.

FIG. 2 shows a cross section of an exemplary trench-shielded Schottky barrier diode device 100 according to the present subject matter. Semiconductor device 100 comprises a net n+ doped substrate 105, a net n-type semiconductor layer 110 disposed on substrate 105, a plurality of electrically insulated trench electrodes 130 disposed into semiconductor layer 110 at the top surface thereof, and a plurality of semiconductor mesa regions 120 disposed between the trench electrodes 130. As apparent from the figure, the depth of trench electrodes 130 equals the height of mesa regions 120. Layer 110 is typically fabricated with n-type dopant grown into it, without any p-type dopant present, in which case the "net" n-type doping concentration and the introduced n-type doping can have the same value. A trench electrode 130 may comprise a center conductive electrode 132 and an outer electrically insulating oxide layer 134. Center conductive electrode 132 may comprise a metal and/or doped polysilicon. Outer insulating layer 134 may comprise an oxide, such as silicon dioxide. A mesa region 120 has a top surface adjacent to the layer 110's top surface, a width $W_M$ as measured at a location halfway up the side walls of the mesa region (e.g., middle of the mesa), and a net n-type doping concentration profile along the center line of the mesa, which varies with distance from the top surface of the mesa region. Device 100 further comprises a region 150 of graded net n-type doping concentration adjacent to the top surface of a mesa region 120. In graded region 150, the net n-type doping concentration decreases in value with distance from the top surface of the mesa region. That is, at or near the top surface, the net n-type doping concentration starts at a first value and decreases from the first value as one moves into the bulk of the mesa region toward the bottom of the mesa region along the center line of the mesa region. The net n-type doping concentration may then level off at a second value at a distance of 0.125 microns to 0.5 microns from the top surface of mesa region 120, as measured in the as formed device, for devices with mesa heights of one to two microns. For devices with mesa heights (trench depths) of more than one micron, the point where the net n-type doping concentration levels off at the second value may be at a distance of up to half the value of the mesa height (trench depth). The net n-type doping concentration may then increase from this point with further distance into the mesa region (e.g., as one moves further into the mesa region toward the bottom of the mesa region). The increase in net n-type doping concentration provides the benefit of lowering the on-state resistance of the device.

In an exemplary implementation, semiconductor layer 110 may have a thickness of 4.25 μm (microns), trench electrode 130 may have a depth of 1.1 μm, insulating layer 134 may comprise silicon dioxide having a thickness of 400 Angstroms, and mesa region 120 may have a width in the range of 0.2 μm to 0.6 μm, with its sidewalls being inclined at an angle of about 89 degrees with respect to the layer 110's bottom surface. In typical implementations, the mesa width is in the range of 0.2 μm to 0.4 μm, and preferably in the range of 0.25 μm to 0.35 μm. Substrate 105 may have a net n-type doping concentration of $5 \times 10^{18}$ cm$^{-3}$ to $1 \times 10^{20}$ cm$^{-3}$. The maximum net n-type doping concentration within mesa region 120 may have a value in the range of $4 \times 10^{15}$ cm$^{-3}$ to $2 \times 10^{17}$ cm$^{-3}$, and in typical implementations may have a value in the range of $8 \times 10^{15}$ cm$^{-3}$ to $8 \times 10^{16}$ cm$^{-3}$. The maximum net n-type doping concentration within graded portion 150 may have these same ranges. The net n-type doping concentration at the top surface of mesa region 120 is generally less than approximately $1 \times 10^{17}$ cm$^{-3}$ when the mesa comprises silicon semiconductor in order to ensure the formation of a Schottky contact (e.g., non-ohmic contact), and preferably equal to or less than $4 \times 10^{16}$ cm$^{-3}$.

Device 100 further comprises a nickel silicide layer 140 formed at the top surfaces of electrodes 132 and mesas 120, an interconnect metal layer 145 formed over nickel silicide layer 140, and a bottom metal electrode layer 160 electrically coupled to the substrate 105 and n-type layer 110. Nickel silicide layer 140 provides Schottky-contact electrodes disposed at the top surfaces of mesa regions 120, and metal layer 145 interconnects these electrodes to electrodes 132. Nickel silicide layer 140 may be formed by depositing a layer of elemental nickel on the surfaces of mesas 120 and polysilicon electrodes 132, and thereafter heating the surface of the substrate to a high temperature to form a nickel silicide layer. During this formation process, top portions of the silicon and polysilicon (if used for contacts 132) are consumed. Typically, 0.05 microns to 0.25 microns of silicon are consumed.

When electrodes 132 comprise polysilicon, the doping concentration of the polysilicon is sufficiently high that the silicide layer forms conductive contacts to electrodes 132. (When electrodes 132 comprise metal, the deposited nickel layer forms an electrical contact to the metal and does not form a silicide.)

As an option, device 100 may further comprise a plurality of enhanced doping regions 170 disposed near the bottom walls of electrodes 130, as more fully described in Applicants' co-pending U.S. patent application Ser. No. 12/368,210, filed Feb. 9, 2009, entitled "Semiconductor Devices With Stable And Controlled Avalanche Characteristics and Methods Of Fabricating The Same," which is incorporated herein by reference for all purposes. Enhanced doping regions 170 may have net peak n-type doping concentrations that are at least 50% higher or $2 \times 10^{16}$ cm$^{-3}$ greater than the net n-type doping concentrations of semiconductor layer 110 and the maximum net n-type doping concentration of mesa region 120, and typically have net peak n-type doping concentrations that are 2 to 5 times higher. Regions 170 can be readily formed by ion-implanting an n-type dopant into the bottom walls of the trenches 130 before the electrodes are formed, followed by annealing the implant. The annealing treatment can cause the dopant to migrate toward the centerline of the mesa, as indicated by the dashed lines 170' in the figure. A typical implant dose can range from $5 \times 10^{12}$ cm$^{-2}$ (dopant atoms per square centimeter of implanted surface area) to $2 \times 10^{13}$ cm$^{-2}$, and may have an implant energy and anneal treatment that diffuses the implant 0.1 microns to 2 microns into semiconductor layer 110. As explained in greater detail in Applicants' above-identified co-pending U.S. patent application, enhanced doping regions 170 act to pin the avalanche regions to locations below mesa region 120, thereby preventing the breakdown voltage from increasing with repeated exposures of the device to breakdown conditions.

Figure 3:
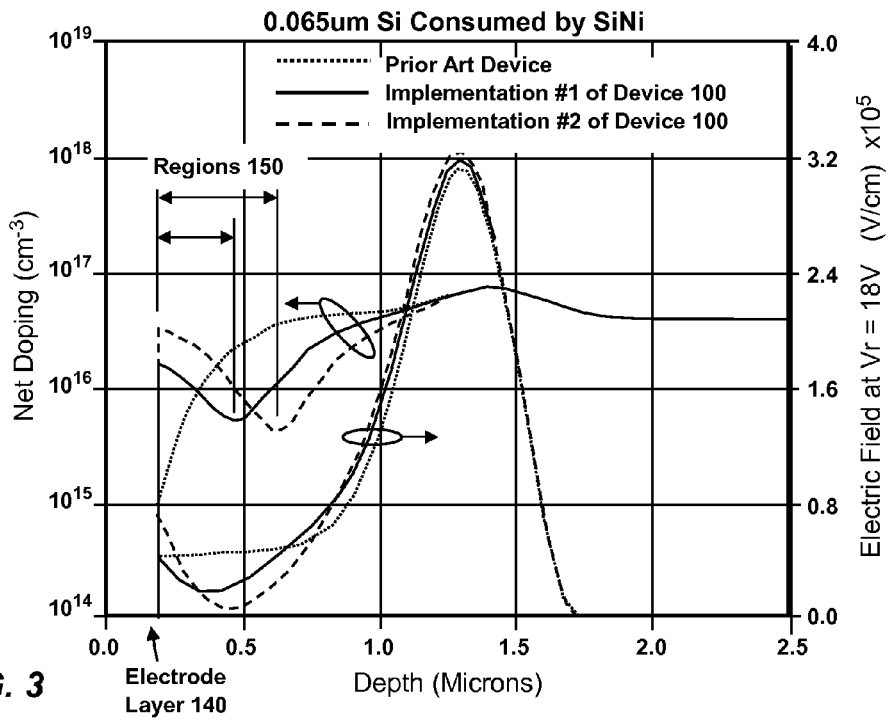
FIG. 3 shows a graph of the net n-type doping concentration profiles and electric field profiles for a comparative device and two exemplary implementations of an exemplary device according to the present subject matter, with a first amount of semiconductor consumed by a contact formation process.

FIG. 3 shows a graph of the net n-type doping concentration for the comparative device shown in FIG. 1 (dotted line), a first exemplary implementation of device 100 where graded region 150 is without about 0.25 microns of the top surface of mesa 120 (solid line), and a second exemplary implementation of device 100 where graded region 150 is within about 0.5 microns of the top surface of mesa 120 (dashed line). For consistency, all three device implementations shown in FIG. 3 include enhanced doping regions 170' and mesa heights (trench depths) of about 1.1 microns. The X-axis is the distance into the device surface, as measured at the top of metal layers 45 and 145, and the leftmost Y-axis is the net n-type doping concentration. For all of the device implementations illustrated in FIG. 3, an average of 0.065 microns of the mesa's silicon at the top surface has been consumed in the nickel silicide formation process. The tops of the mesas 20 and 120 are, on average, located at 0.2 microns on the X-axis, and the bottoms of the mesas are, on average, located at 1.3 microns on the X-axis. The comparative device has a net n-type doping concentration of $1 \times 10^{15}$ cm$^{-3}$ at the top of mesa 20, and increases monotonically in the mesa region to a plateau value of $4 \times 10^{16}$ cm$^{-3}$ in the middle of the mesa, and remains at or above that level to the bottom of the mesa at 1.3 microns. The lower value at the top of the mesa in the comparative device is caused by the shallow p-type implant, which compensates some of the N-type dopant of layer 10. In contrast, both implementations of device 100 have higher net N-type doping concentrations of about $1.17 \times 10^{16}$ cm$^{-3}$ (solid line) and $3.3 \times 10^{16}$ cm$^{-3}$ (dashed line) at the tops of mesas 120, and decrease monotonically to trough values of about $5.2 \times 10^{15}$ cm$^{-3}$ at 0.45 microns on the X-axis and about $4.2 \times 10^{15}$ cm$^{-3}$ at 0.6 microns on the X-axis, respectively. From these troughs, the net N-type doping concentration increases monotonically to a value of $4 \times 10^{16}$ cm$^{-3}$ near the bottom of the mesa (X-axis value of about 1.2 microns) in both of the implementations of device 100. The net n-type doping concentration profiles for all three device implementations show a bump up to about $8 \times 10^{16}$ cm$^{-3}$ in the range of about 1.2 microns to 1.7 microns due to enhanced doping regions 170'.

Also shown in FIG. 3 are the profiles of the electric field profiles in the three device implementations under a reverse bias of 18 volts. All three profiles have a peak value of $3.2 \times 10^5$ V/cm near the bottom of the trench (1.3 microns on the X axis). In comparative device 1 (dotted line), the electric field is at a relatively flat value of $0.4 \times 10^5$ V/cm in the middle and top portions of mesa region 20. In both of the exemplary implementations of device 100, the electric field profiles have parabolic shapes in the middle and top portions of mesa regions 120, and have values below the $0.4 \times 10^5$ V/cm value of comparative device 1, except for the electric field profile near the top surface of the mesa for the second implementation of device 100, which rises to a value of $0.7 \times 10^5$ V/cm at the mesa's top surface. The reverse-bias leakage current of a device is roughly related to the value of the electric field at the top surface of the mesa. Accordingly, since device 1 and the first implementation of device 100 have approximately the same electric field at the top surface, it would be expected that the devices would have similar values of leakage current, which is the case. And, since the second implementation of device 100 has a higher electric field at the mesa's top surface, it would be expected that it would have a higher value of leakage current, which is the case.

Figure 5:
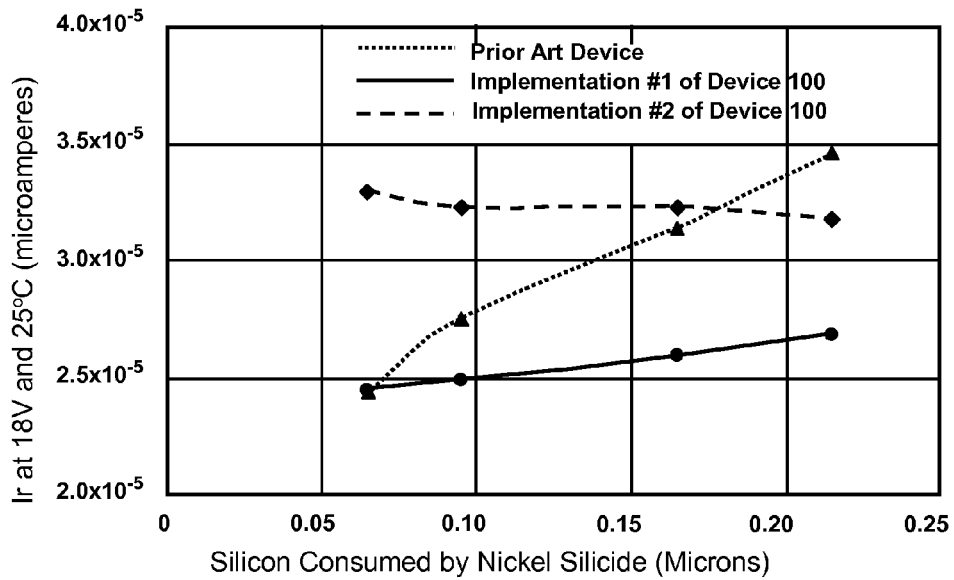
FIG. 5 is a graph of reverse-bias leakage current at a temperature of 25° C. for a comparative device and two exemplary implementations of an exemplary device according to the present subject matter, plotted as a function of the amount of semiconductor consumed by a contact formation process.
Figure 6:
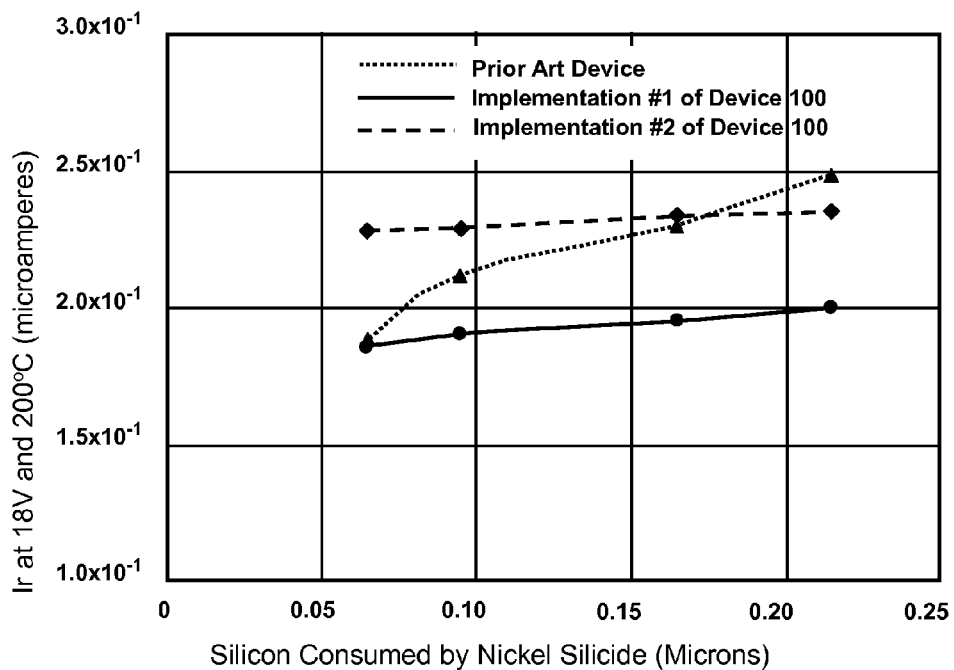
FIG. 6 is a graph of reverse-bias leakage current at a temperature of 200° C. for a comparative device and two exemplary implementations of an exemplary device according to the present subject matter, plotted as a function of the amount of semiconductor consumed by a contact formation process.

FIGS. 5 and 6 are graphs of reverse-bias leakage current (Ir) at 18V reverse bias for the three device implementations at temperatures of 25° C. and 200° C., respectively, plotted as a function of the amount of silicon consumed by the nickel silicide formation process. For the devices illustrated in FIG. 3 where 0.065 microns of silicon were consumed by the silicide process, the first implementation of device 100 (solid line) and comparative device 1 (dotted line) have substantially the same leakage current at both temperatures, while the second implementation of device 100 (dashed line) has a higher leakage current (see the left ends of the graphs in FIGS. 5 and 6). As the amount of silicon consumed increases, there is significant change in the leakage current of comparative device 1, but relatively little change in the first and second implementations of device 100. This is a significant advantage in that the devices made on the same wafer can have a greater uniformity of their electrical characteristics, and devices made on different wafers using the same manufacturing process can also have a greater uniformity of their electrical characteristics, despite variations in the amount of silicon consumed during the silicide process.

Figure 4:
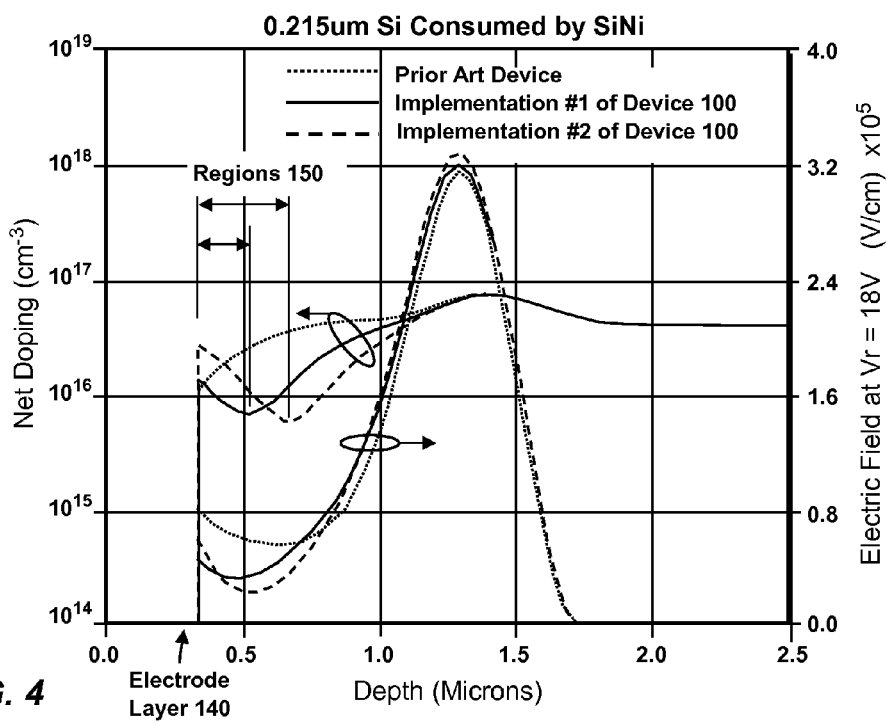
FIG. 4 shows a graph of the net n-type doping concentration profiles and electric field profiles for a comparative device and two exemplary implementations of an exemplary device according to the present subject matter, with a second amount of semiconductor consumed by a contact formation process.

FIG. 4 shows the net n-type doping concentrations and electric fields for the three device implementations in the case where an average of 0.215 microns of the mesa's silicon at the top surface has been consumed in the nickel silicide formation process. (This case corresponds to the data points at the right ends of the graphs in FIGS. 5 and 6.) As seen in FIG. 4, the electric field value at the mesa's top surface for device 1 has doubled in value, while the same electric field value has risen slightly for the first implementation of device 100 and has decreased by a moderate amount for the second implementation of device 100. Without limiting the operation of the inventive aspects to any one particular explanation, it is believed that two main effects are occurring to lower the electric field and leakage current in the implementations of device 100. As a first effect, it is believed that the graded net n-type doping concentration of region 150 of device 100 creates a built-in retarding component to the electric field which is beneficial for reducing leakage current. However, since a significant amount of dopant is consumed along with the silicon during the silicide process, the retarding component can be reduced as the amount of silicon consumed in the silicide process increases. As a second effect, it is also believed that the electric field at the mesa's top surface decreases as the total net n-type doping concentration in the upper portion of the mesa decreases, thereby reducing the electric field in the mesa and the leakage current. This is because a depletion region forms in the mesa under reverse bias conditions due to the action of the trench electrodes 130, and the lowering of the total net doping concentration in the upper portion of the mesa acts to push the depletion region deeper into semiconductor layer 110, thereby reducing the amount of potential and electric field that can reach the top of the mesa. Accordingly, the negative gradient present in region 150 of device 100 decreases the net n-type doping concentration at the top surface as more silicon and dopant are consumed in the silicide process, which in turn decreases the total net doping concentration in the upper portion of the mesa as more silicon and dopant are consumed in the silicide process, which in turn decreases the electric field and the leakage current. These two effects are explored below in greater detail for all three devices shown in FIGS. 3 and 4.

Comparing FIGS. 3 and 4 for the first implementation of device 100 (solid lines), the net n-type doping concentration at the mesa's top surface in FIG. 4 slightly decreases compared to FIG. 3, which tends to reduce the leakage current for FIG. 4 according to the above-described second effect since the total net doping concentration in the upper portion of the mesa is reduce. On the other hand, the gradient of the concentration decreases slightly as well, which tends to increase the leakage current for FIG. 4 according to the above-described first effect since the beneficial retarding component of the electric field is reduced. The counterbalancing action of these two effects is believed to explain why the first implementation of device 100 has low and uniform values of leakage current in FIGS. 5 and 6. Making the same comparison for the second implementation of device 100 (dashed lines), the net n-type doping concentration at the mesa's top surface for FIG. 4 decreases slightly compared to FIG. 3, which tends to reduce the leakage current for FIG. 4 according to the above-described second effect, and the gradient of the concentration increases slightly as well, which also tends to decrease the leakage current for FIG. 4 according to the above-described first effect since the beneficial retarding component of the electric field is increased. These effects are believed to cooperate together to cause the leakage current shown in FIGS. 5 and 6 for the second implementation of device 100 to decrease modestly as the amount of consumed silicon increases. Finally, comparing FIGS. 3 and 4 for comparative device 1 (dotted lines), both the net n-type doping concentration and the electric field at the mesa's top surface increase dramatically in FIG. 4 compared to FIG. 3, which tends to increase the leakage current for device 1 in FIGS. 5 and 6. More specifically, device 1 does not have a retarding component to the electric field because the doping gradient is in the opposite direction (above-described first effect), and the total net doping concentration in the upper portion of the mesa is increased as the amount of silicon and dopant consumed in the silicide process in increased, thereby increasing the leakage current and electric field in the mesa according to the above-described second effect.

Figure 7:
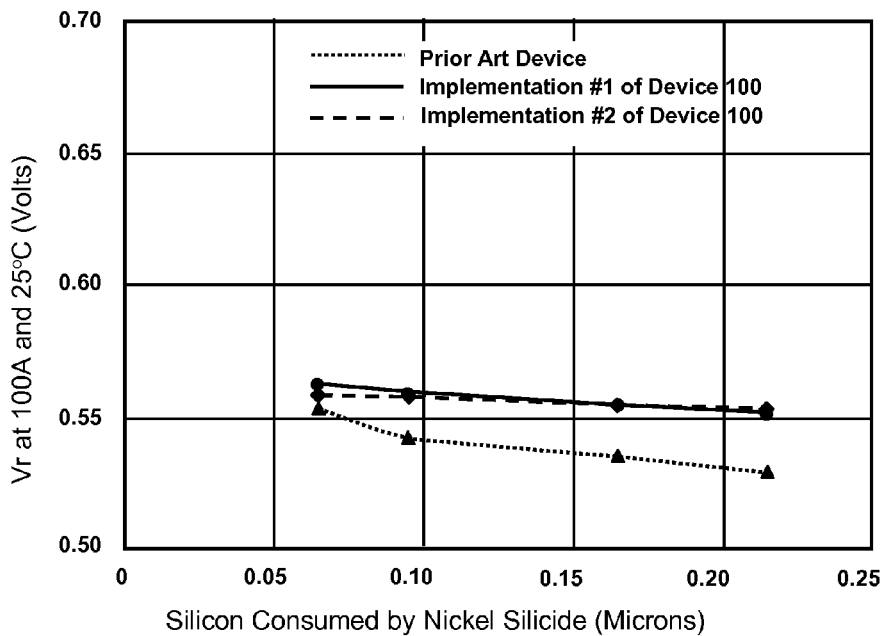
FIG. 7 is a graph of forward voltage at high current density and a temperature of 25° C. for a comparative device and two exemplary implementations of an exemplary device according to the present subject matter, plotted as a function of the amount of semiconductor consumed by a contact formation process.

FIG. 7 shows the forward voltage of the three device implementations as a function of consumed silicon. As seen in the figure, both implementations of device 100 have less variation in the forward voltage than device 1. This is believed to be due to the fact that the first and second implementations of device 100 have less variation in the net n-type doping concentration as a function of consumed silicon compared to device 1.

Region 150 may be formed by a number of processes. In one process, a counter-dopant is deeply implanted into the tops of the mesas 120, such that the peak of the implanted counter-dopant lies 0.15 microns to 0.5 microns (or 50% of the mesa height if the mesa height is greater than one micron) below the average height level of the mesa's top surface in the fully formed device, and more preferably 0.2 microns to 0.4 microns (or 40% of the mesa height if the mesa height is greater than one micron) below the average height level of the mesa's top surface. When using boron as a counter dopant, the implant energy may be equal to or greater than 70 KeV, and may be equal to or less than 300 KeV. In typical implementations with mesa heights in the range of 1 to 2 microns, the boron implant has an energy that ranges from 80 KeV to 160 KeV, and typically ranges between 100 KeV and 140 KeV. The implant energy may be selected in consideration of the amount of expected consumption of silicon by the Schottky-contact formation process, with a goal of placing the peak of the implant between one-eighth of a micron and one-half of a micron (or 50% of the mesa height if the mesa height is greater than one micron) below the average level of the Schottky contact in the as formed device, and more preferably between one-eighth of a micron and three-eighths of a micron (or 40% of the mesa height if the mesa height is greater than one micron) below the average level of the Schottky contact in the as formed device. The implant dose may be selected, in consideration of subsequent thermal exposures that the device will be exposed to during subsequent manufacturing steps, to provide a ratio of two or more between the net n-type dopant concentration at the mesa's top surface to the net n-type dopant concentration at the trough. This ratio can be four or more, and may range up to values of 10 or more. The peaks of the implants will correspond to the troughs of net n-type doping concentration in regions 150. As examples, the doping profiles shown in FIGS. 3 and 4 for the first implementation of device 100 (solid lines) may be done by a boron implant having an implant energy of 120 KeV and dose of $2.8 \times 10^{12}$ atoms/cm$^2$, and for the second implementation of device 100 (dashed lines) may be done by a boron implant having an implant energy of 160 KeV and dose of $2.9 \times 10^{12}$ atoms/cm$^2$. As another example of forming region 150, layer 110 may be epitaxially grown with n-type dopant selectively incorporated to provide the graded net n-type doping concentration profile of region 150. As yet another example of forming region 150, a lightly n-type doped layer 110 may be implanted with a shallow n-type dopant.

Figure 8:
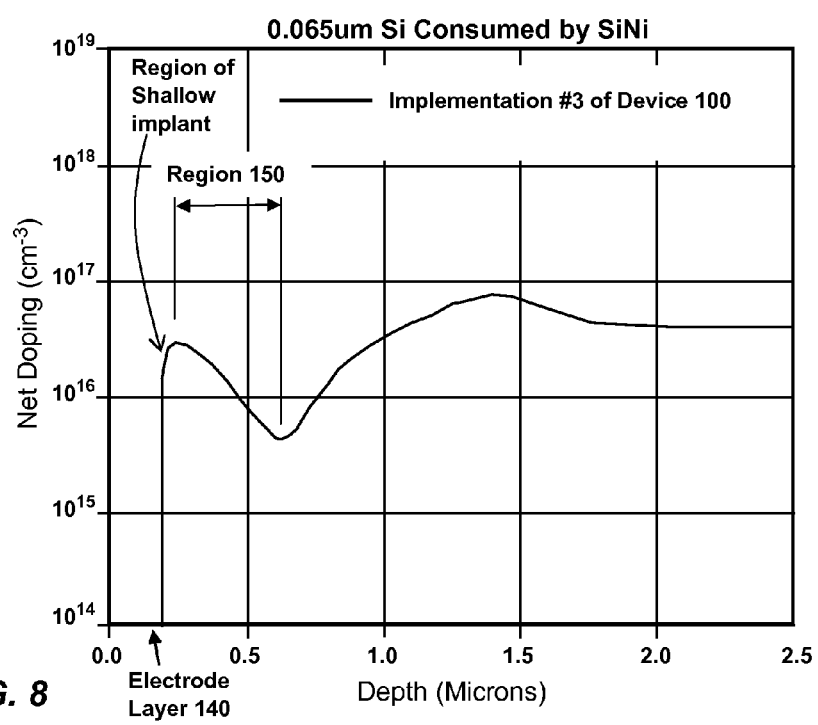
FIG. 8 shows a graph of the net n-type doping concentration profile for a third exemplary implementation of an exemplary device according to the present subject matter, with a first amount of semiconductor consumed by a contact formation process.

It may be appreciated that a shallow p-type implant may be provided in an implementation of device 100 to lower the net n-type doping concentration at the top surface of the mesa in order to adjust the forward voltage characteristics of the device, and to ensure a Schottky contact. This is illustrated by a third implementation of device 100, the doping profile of which is shown in FIG. 8, for a value of 0.065 microns of silicon consumed by the silicide process. As can be seen by the profile, there is a portion of the mesa region between electrode layer 140 and region 150 where the net n-type doping concentration increases with distance from electrode layer 140. Thus, as more silicon is consumed by the silicide process, the total net doping concentration in the entirety of the mesa will increase slightly and then decrease as the consumed silicon enters region 150, thereby leading to slightly greater variation in leakage characteristics compared to the first and second implementation, but nonetheless substantially uniform compared to the comparative device.

While device 100 has been illustrated with the use of nickel silicide, it may be appreciated that device 100 and the present subject matter may be practiced with other silicide or metal systems, and will provide similar benefits of reduced variations in electrical properties. While device 100 has been illustrated as an n-channel device with an n-type substrate 105, n-type semiconductor layer 110, n-type net doping concentration in mesas 120 and regions 150, and n-type enhanced doping regions 170, it may be appreciated that the device may be constructed as a p-channel device with a p-type substrate 105, p-type semiconductor layer 110, p-type net doping concentration in mesas 120 and regions 150, and p-type enhanced doping regions 170. Accordingly, the claims encompass these possible channel constructions by reciting that these elements are of "a first conductivity type". If a dopant implant is used to form region 150 in a p-channel implementation of device 100, an n-type dopant, such phosphorous or arsenic, may be implanted.

Figure 9:
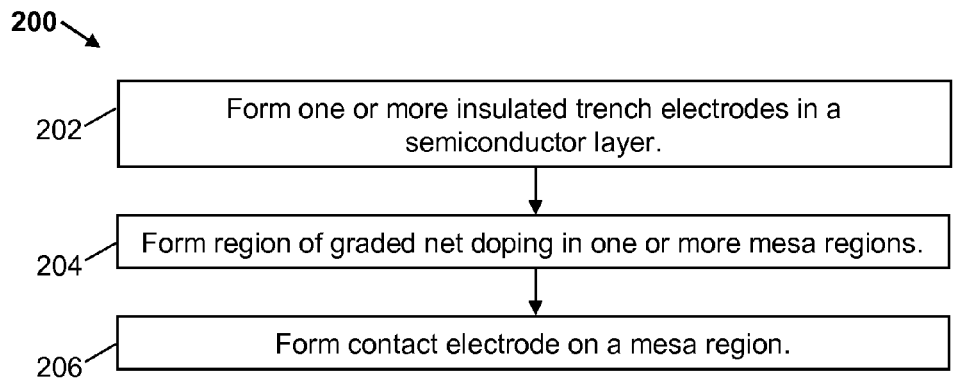
FIG. 9 shows a flow diagram of an exemplary method according to the present subject matter.

Exemplary methods of manufacturing device 100 are now described. A first method is illustrated by a flow diagram 200 shown in FIG. 9. As illustrated at block 202, the method may comprise forming one or more electrically insulated trench electrodes in a semiconductor layer at a first surface thereof to define one or more mesas in the semiconductor layer at the first surface thereof. A mesa has a top surface at the first surface of the semiconductor layer. Exemplary processes of forming the trench electrodes are described below in greater detail. As illustrated at block 204, the first general exemplary method may further comprise forming a region of graded net doping concentration of a first conductivity type within a portion of a mesa, the region being located within a half micron (or 50% of the mesa height if the mesa height is greater than one micron) of the mesa's top surface, and the graded net doping concentration decreasing in value with distance from the mesa's top surface. When layer 110 comprises a moderate doping of the first conductivity type, the graded region may be formed by ion implanting a compensating dopant (dopant of a second conductivity type opposite tot the first conductivity type) into the tops of the mesas with a peak implant depth that is between 0.125 microns and 0.5 microns (or 50% of the mesa height if the mesa height is greater than one micron) below the average height level of the tops of the mesas in the completely formed devices. The implant may be annealed with a thermal treatment. The tops of the trench electrodes need not be masked for the implant, but may be masked if desired. The dosage of the implant is selected to provide the above described array of graded doping profiles, taking into account the temperature exposure of the annealing treatment and any subsequent exposures to elevated processing temperatures. It is common practice in the semiconductor art to use computer simulation programs to model the diffusion of implants during annealing and other processing actions to estimate their profiles in the finally formed device. It is well within the ability of one of ordinary skill in the art to use such a simulation program to select an implant energy and implant dose that provides a desired final profile for the implant. When implanting boron as a dopant of the second conductivity type, the implant energy is typically above 70 KeV and below 300 KeV, and often ranges from 80 KeV to 160 KeV, and typically ranges between 100 KeV and 140 KeV. When layer 110 comprises a moderate doping of the first conductivity type (such as $5\times10^{15}$ cm$^{-3}$ or less), the graded region may be formed by implanting additional doping of the first conductivity type at the surface of the semiconductor layer with one or more low-energy implants (shallow implants of less than 40 KeV, and typically less than 20 KeV), followed by annealing or equivalent heat treatment. As illustrated at block 206, the first general method further comprises forming a contact electrode on the top surface of at least one mesa. The contact electrode may comprise a Schottky-contact electrode, and may further comprise a metal silicide, such as nickel silicide. An exemplary process of forming a nickel silicide contact electrode is described below.

Figure 10:
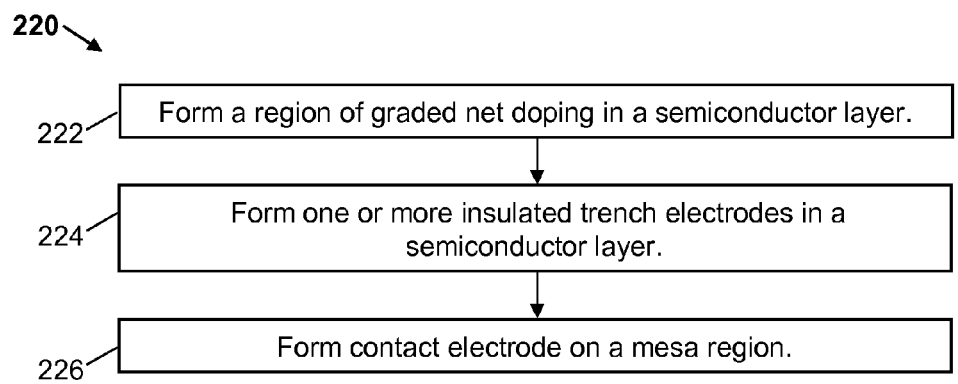
FIG. 10 shows a flow diagram of another exemplary method according to the present subject matter.

A second method of manufacturing device 100 is illustrated by a flow diagram 220 shown in FIG. 10. As illustrated at block 222, the method may comprise forming a region of graded net doping concentration of a first conductivity type within a portion of a semiconductor layer, the region being located within a half micron of a first surface of the semiconductor layer (or 50% of the mesa height if the mesa height is greater than one micron), and the graded net doping concentration decreasing in value with distance from the first surface of the semiconductor layer. The region may be formed by a number of techniques, including (1) either of the above-described implantations that may be used in the first general method, and (2) varying the amount of dopant incorporated during an epitaxial growth of the semiconductor layer to achieve a desired net doping profile in consideration of the subsequent thermal treatments. As illustrated at block 224, the second general method further comprises forming one or more electrically insulated trench electrodes in the semiconductor layer at the layer's first surface to define one or mesa regions in the semiconductor layer at the layer's first surface, a mesa region having a top surface at the first surface of the semiconductor layer. Exemplary processes of forming the trench electrodes are described below in greater detail. As illustrated at block 226, the second general method further comprises forming a contact electrode on the top surface of a mesa region. The contact electrode may comprise a Schottky-contact electrode, and may further comprise a metal silicide, such as nickel silicide. An exemplary process of forming a nickel silicide contact electrode is described below.

The above methods are encompassed by the following method, which comprises forming a mesa region of semiconductor material having a top surface and a portion of graded net doping concentration of a first conductivity adjacent to the top surface, the portion being located within a half micron (or 50% of the mesa height if the mesa height is greater than one micron) of the top surface of the mesa region and the graded net doping concentration therein decreasing in value with distance from the top surface of the mesa region; and forming a contact electrode on the top surface of at least one mesa.

Exemplary trench electrode formation processes are now described. In either of the first and second general methods, the one or more trench electrodes may be formed by disposing an etch mask over the semiconductor layer to protect the mesa locations, and then performing an anisotropic etching process through the etch mask. The anisotropic etching process may comprise a plasma etching process. Fluorine-based plasma etchants may be used to provide rounded bottom surfaces for the trenches. Such fluorine-based plasma etchants include: $SF_6$ sulfur (hexafluoride), $SF_6$ plus an inert gas (e.g., a noble gas), $SF_6$ plus oxygen and one or more inert gases (e.g., He and Ar), and $SF_6$ plus hydrogen bromide (HBr) and one or more inert gases (e.g., He and Ar). In addition, other fluorine-based etchants, such as $C_2F_6$, $C_4F_8$, $NF_3$, etc., may be used along with the above-identified inert gasses ($O_2$, HBr, etc.). The fluorine etches the silicon substrate, while oxygen and HBr form byproducts on the trench sidewalls that minimize the etching of the sidewalls. Exemplary etching processes may be found in U.S. Pat. No. 6,680,232 to Grebs, et al., which is incorporated herein by reference, and which is commonly assigned herewith.

If a plasma etch is used, it may be followed by a soft cleaning etch of the trench side and bottom walls, which can remove any crystal damage caused by the plasma etching process. The prior etch mask may be left in place, and any known chemical etchant for silicon may be used (an isotropic aqueous chemical etchant may be used). As one example, a soft plasma etch (e.g., $CF_4$ downstream microwave plasma) may be used to remove about 300 Angstroms of material, followed by a cleaning with a conventional $H_2SO_4/H_2O_2$ etch, followed by an RCA SC-1 standard cleaning etch. The soft plasma etch is more isotropic and less energetic that the prior anisotropic etch, and is preferably more isotropic than anisotropic. As an alternative to this soft cleaning etch action, or in addition to it, a sacrificial silicon dioxide layer of about 400 Angstroms may be grown by conventional oxidation at a temperature of 1100° C. or higher, and thereafter removed by a suitable etchant (e.g., an isotropic aqueous chemical etchant, such as a buffered oxide etchant, may be used). The sacrificial oxide also ties up dangling silicon bonds on the trench sidewalls caused by the previous plasma etching processes, and also improves the quality of the trench dielectric layers that will be formed later. A second sacrificial oxide may be grown and removed to provide further rounding of the bottom surfaces of the trenches and the top edges of the mesas. After the one or more sacrificial oxides have been grown and removed, the top surface of the substrate and the trenches may be cleaned with a conventional $H_2SO_4/H_2O_2$ etch followed by an RCA SC-1 standard cleaning etch.

As an optional action, a dopant of the first conductivity type may be ion-implanted into the bottom walls of the trenches to provide the starting doping for enhanced doping regions 170, if these regions are used in device 100. Arsenic (As) may be used for the implanted dopant, and the prior etch mask may be left in place to prevent the dopant from being implanted at the top surfaces of the mesas. A heat treatment process is performed to diffuse the implant into semiconductor layer 110 to activate the dopant and to provide enhanced doping regions 170. This implant may occur before the growth of the above-identified sacrificial oxide layer, and the thermal exposure used in the growth of the sacrificial oxide and other subsequent processing actions may be used to diffuse and activate the implant for enhanced doping regions 170. As another approach, the implant for regions 170 may be performed after the sacrificial oxide layer is grown, and be implanted through the sacrificial oxide. This approach allows the sacrificial oxide to help protect the side walls of the mesa from receiving the implant. The thermal exposure used in subsequent processing actions may be used to diffuse and activate the implant for enhanced doping regions 170.

Next, the dielectric layers 134 of the trench electrodes 130 may be formed. This action may comprise growing a thin oxide layer on the trench sidewalls at a high temperature of 1100° C. or more in a dry oxygen environment (no water vapor) that is diluted with an inert gas. The oxide layer may be grown to a thickness in the range of about 400 Angstroms to 600 Angstroms. Since the mesa tops are exposed during the growth process, this oxide layer is also formed over the mesa tops. In one typical implementation, the growth temperature is in the range of 1125° C. to 1200° C., with a value of about 1175° C. (±10° C.) being preferred, and the environment comprises 50% oxygen and 50% argon (e.g., a flow rate of 10 liters per minute for oxygen, and a flow rate of 10 liters per minute for argon). The combined use of the high growth temperature and diluted dry oxygen environment to grow the shield oxide layer is unusual in the power semiconductor art, but the combination has been found to provide fewer pinhole defects in the layer leading to improved oxide quality, higher values of $Q_{bd}$ (charge to breakdown), and a better thickness uniformity. The oxygen may be diluted such that it composes 10% to 75% by volume of the gaseous growth environment, and more preferably 25% to 60% by volume of the gaseous growth environment.

The trench electrodes 132 may be formed by depositing a layer of polysilicon material over the previously formed thin oxide layer, which in turn was formed over the top surface of the substrate (mesa tops) and sidewalls of the trenches. The deposition may be done by conventional polysilicon deposition equipment known to the art. To fill the trench areas with polysilicon material at a trench width of about 0.5 microns and a trench depth of 1.1 microns, the polysilicon material may be deposited to a thickness of 5000 Angstroms (0.5 microns), as measured at the substrate's top surface, at a temperature of 560° C. This amount of material is sufficient to coat the sidewalls of the trenches and fill them in. In general, to prevent voids from occurring in the shield electrode, the polysilicon (or other shield material) should be deposited at a thickness that ranges from one-half of the width of the trench being filled to twice the width. Typically, the deposited thickness is equal to the width of the trench. The polysilicon may be deposited in doped form or un-doped form. If deposited in doped form, it is preferably doped in situ during deposition, and has a doping level of $1 \times 10^{18}$ dopant atoms per cubic centimeter ($cm^{-3}$) or higher, and more preferably a doping level of $5 \times 10^{18}$ $cm^{-3}$ or higher. In situ doping may be accomplished by introducing a dopant-containing gas (e.g., phosphine for n-type, and dirborane or boron trifluoride for p-type) along with the gases used to form the polysilicon (e.g., silane and ammonia). If deposited in un-doped form, the polysilicon may be vapor-phase exposed to a dopant gas during a subsequent anneal stage (described below), or may be implanted with dopant at a dose of $5 \times 10^{15}$ dopant atoms per square centimeter ($cm^{-2}$) at an implant energy of 30 KeV prior to anneal. The dopant dose may be in the range of $5 \times 10^{14}$ $cm^{-2}$ to $5 \times 10^{16}$ $cm^{-2}$. A more uniform dopant distribution can be obtained by implanting the dose at two or more implantation energies. For example, a first implantation at a dose of $2.5 \times 10^{15}$ $cm^{-2}$ at 120 KeV and a second implantation at a dose of $2.5 \times 10^{15}$ $cm^{-2}$ at 30 KeV may be used.

The dopant for the polysilicon may be n-type or p-type. N-type dopant is conventionally used in the art, and p-type dopant is not used in the art. However, the inventors have found that p-type doping for the shield electrodes can provide a better work function value for the material, which in turn provides better shielding of mesas 120 (shown in FIG. 2).

After the polysilicon has been deposited and optionally implanted, it may be annealed at a temperature of 800° C. or more for a sufficient time to consolidate the polysilicon grains and to redistribute the implanted doping (if used). An anneal temperature of 950° C. may be used. If the polysilicon is to be vapor-phase doped during anneal, then the anneal temperature may be raised to 1000° C. or more. Any oxide that forms over the polysilicon during the anneal process may be removed by a brief exposure to a buffered oxide etch, and the substrate may be cleaned with a conventional $H_2SO_4/H_2O_2$ etch followed by an RCA SC-1 standard cleaning etch. At this point, a layer of polysilicon is on top of the thin oxide layer, which is on the mesa tops. A conventional polysilicon etch may then be performed to etch back the polysilicon that is left on the tops of the mesas, with the previously-formed thin oxide layer acting as an etch stop. This etches off the top portion of the polysilicon layer over both the mesas and the trenches. The polysilicon etch may continue a small duration more to provide a slight etch back of the polysilicon in the trenches so that the top level of the shield electrodes lies below the tops of the mesas. After the polysilicon etch, the substrate may be cleaned with a conventional $H_2SO_4/H_2O_2$ etch followed by an RCA SC-1 standard cleaning etch.

An Exemplary Nickel Silicide Formation Process is Now Described.

An exemplary nickel silicide formation process may comprise exposing the tops of the mesas and the shield electrodes to a hydrofluoric (HF) etchant for a brief time duration to remove any oxide that has formed, evaporating about 1000 Angstroms of nickel (Ni) on the surface of the substrate, performing a first anneal of the nickel layer at a temperature in the range of 250° C. to 400° C. for about five minutes, and performing a second anneal at a temperature in the range of 400° C. to 700° C. for about five minutes. The first anneal process converts a substantial portion of the nickel layer to $Ni_2Si$, and the second anneal process converts the $Ni_2Si$ to NiSi. In one implementation, the first anneal temperature is at about 350° C. (±10° C.), and the second anneal temperature is at about 500° C. (±25° C.). The annealing process converts about 1000 Angstroms of the tops of the mesas from silicon to nickel silicide, and forms Schottky barriers at the top surfaces of the mesas. The annealing process also converts a portion of the tops of the polysilicon shield electrodes, and forms conductive contacts with the shield electrodes due to the high level of doping in shield electrodes.

It should be understood that where the performance of an action of any of the methods disclosed above and claimed herein is not predicated on the completion of another action, the actions may be performed in any time sequence (e.g., time order) with respect to one another, including simultaneous performance and interleaved performance of various actions. (Interleaved performance may, for example, occur when parts of two or more actions are performed in a mixed fashion.) Accordingly, it may be appreciated that, while the method claims of the present application recite sets of actions, the method claims are not necessarily limited to the order of the actions listed in the claim language, but instead cover all of the above possible orderings, including simultaneous and interleaving performance of actions and other possible orderings not explicitly described above, unless otherwise specified by the claim language (such as by explicitly stating that one action precedes or follows another action).

Any recitation of "a", "an", and "the" is intended to mean one or more unless specifically indicated to the contrary.

The terms and expressions which have been employed herein are used as terms of description and not of limitation, and there is no intention in the use of such terms and expressions of excluding equivalents of the features shown and described, it being recognized that various modifications are possible within the scope of the claims.

While the various embodiments are mostly described in the context of N-channel trench shielded devices, embodiments according to the present subject matter may be implemented as P-channel trench-shielded devices where the conductivity types of the layers and regions are reversed. Moreover, while the embodiments have been illustrated using Schottky barrier rectifiers, embodiments according to the present subject matter may be implemented with MOSFET structures, IGBT structures, BJT structures, shielded gate synchronous rectifiers (e.g., integrated shielded gate MOSFET and Schottky), and superjunction variations of the devices described herein (e.g., devices with columns of alternating conductivity type silicon).

Moreover, one or more features of one or more embodiments may be combined with one or more features of other embodiments without departing from the scope of the present subject matter.

While the present subject matter has been particularly described with respect to the illustrated embodiments, it will be appreciated that various alterations, modifications, adaptations, and equivalent arrangements may be made based on the present disclosure (e.g., various changes may be made and equivalents may be substituted for elements thereof to adapt to particular situations), and are intended to be within the scope of the present subject matter and the appended claims.

What is claimed is:

1. A semiconductor device, comprising:
a semiconductor layer;
a trench disposed in the semiconductor layer;
a first electrode disposed in the trench;
a mesa region adjacent to the trench and being defined, at least in part, by the trench, the mesa region having a top surface and a graded region, the graded region having a doping concentration decreasing with increasing depth from the top surface of the mesa region, the doping concentration of the graded region being highest at the top surface of the mesa region, the first electrode having at least a portion electrically insulated from the mesa region; and
a second electrode disposed on the top surface of the mesa region, the second electrode being a first portion of a Schottky contact, the top surface of the mesa region being a second portion of the Schottky contact.

2. The semiconductor device of claim 1, wherein the graded region has a depth of at least a quarter-micron from the top surface of the mesa region.

3. The semiconductor device of claim 1, wherein a portion of the mesa region located below the graded region has a doping concentration that increases with increasing depth from the top surface of the mesa region.

4. The semiconductor device of claim 1, wherein the mesa region has a portion disposed between the graded region and a third electrode, the doping concentration of the portion of the mesa region increasing with increasing depth from the top surface of the mesa region.

5. The semiconductor device of claim 1, wherein the first electrode has at least one side wall and a bottom wall,
the semiconductor device further comprising:
an enhanced doping region disposed in the semiconductor layer and having a net doping concentration that is greater than a maximum value of a doping concentration of the mesa region, the enhanced doping region being disposed adjacent to the bottom wall of the trench.

6. The semiconductor device of claim 5, wherein the net doping concentration of the enhanced doping region is greater than the maximum value of the doping concentration of the mesa region by at least an amount of $2\times10^{16}$ cm$^{-3}$.

7. The semiconductor device of claim 1, wherein the graded region has a maximum doping concentration and a minimum doping concentration, a ratio of the maximum doping concentration to the minimum doping concentration is equal to or greater than two.

8. The semiconductor device of claim of claim 1, wherein a maximum doping concentration in the mesa region is equal to or less than $2\times10^{17}$ cm$^{-3}$.

9. The semiconductor device of claim 1, wherein the graded region has a maximum doping concentration equal to or less than $8\times10^{16}$ cm$^{-3}$.

10. The semiconductor device of claim 1, wherein a top surface of the first electrode is in contact with the second electrode.

11. The semiconductor device of claim 1, wherein the graded region has a depth of less than one-half of a height of the mesa region.

12. The semiconductor device of claim 1, further comprising a dielectric insulating the first electrode from the mesa region, the second electrode having a first portion disposed on the top surface of the mesa region and a second portion disposed on a top surface of the first electrode, the first portion of the second electrode being electrically insulated from at least a portion of the second portion of the second electrode by the dielectric.

13. A method of making a semiconductor device, comprising:
forming a mesa region of semiconductor material in a semiconductor layer, the mesa region having a top surface;
forming a graded region of the mesa region having a doping concentration decreasing with increasing depth from the top surface of the mesa region, the doping concentration of the graded region being highest at the top surface of the mesa region, the graded region having a same net conductivity type as the semiconductor layer; and
forming a contact electrode on the top surface of the mesa region, the contact electrode being a first portion of a Schottky contact, the top surface of the mesa region being a second portion of the Schottky contact.

14. The method of claim 13, the method further comprising:
forming a trench in the semiconductor layer to define the mesa region.

15. The method of claim 13, wherein the forming of the mesa region includes implanting a boron dopant at an energy of at least 70 KeV.

16. The method of claim 13, wherein the forming of the mesa region includes implanting a dopant at an energy of 40 KeV or less.

17. The method of claim 13, wherein the graded region has a depth of less than one-half micron.

18. The method of claim 13, wherein the contact electrode is a silicide layer.

19. A semiconductor device, comprising:
a semiconductor layer;
a mesa region disposed in the semiconductor layer, the mesa region having a top surface and a graded region, the graded region having a doping concentration decreasing with increasing depth from the top surface of the mesa region, the doping concentration of the graded region being highest at the top surface of the mesa region, the graded region having a same net conductivity type as the semiconductor layer;
a first electrode disposed in a trench within the semiconductor layer;
a dielectric disposed in the trench and insulating the mesa region from the first electrode; and
a second electrode having a portion disposed on the mesa region, the portion being a portion of a Schottky contact with the top surface of the mesa region.

20. The semiconductor device of claim 19, wherein the graded region has a maximum doping concentration and a minimum doping concentration, a ratio of the maximum doping concentration to the minimum doping concentration is equal to or greater than two.

21. The semiconductor device of claim 19, wherein the portion is a first portion, the second electrode has a second portion disposed on the first electrode.

22. The semiconductor device of claim 19, wherein the portion is a first portion, the second electrode has a second portion disposed on the mesa region, the second portion of the second electrode is insulated from at least a portion of the first electrode by the dielectric.

* * * * *